(12) United States Patent
Lin et al.

(10) Patent No.: US 10,230,405 B2
(45) Date of Patent: Mar. 12, 2019

(54) SYSTEM AND METHOD OF FORWARD ERROR CORRECTION FOR STREAMING MEDIA

(71) Applicant: Nvidia Corporation, Santa Clara, CA (US)

(72) Inventors: Chen Lin, Santa Clara, CA (US); Thomas Meier, Santa Clara, CA (US); Reza Marandian Hagh, San Jose, CA (US); Rahul Gowda, Santa Clara, CA (US)

(73) Assignee: Nvidia Corporation, Santa Clara, CA (US)

( * ) Notice: Subject to any disclaimer, the term of this patent is extended or adjusted under 35 U.S.C. 154(b) by 162 days.

(21) Appl. No.: 14/836,348

(22) Filed: Aug. 26, 2015

(65) Prior Publication Data

US 2017/0063487 A1    Mar. 2, 2017

(51) Int. Cl.
| | |
|---|---|
| *H03M 13/00* | (2006.01) |
| *H03M 13/35* | (2006.01) |
| *H04L 29/06* | (2006.01) |
| *H04L 1/00* | (2006.01) |

(52) U.S. Cl.
CPC ........ *H03M 13/353* (2013.01); *H04L 1/0009* (2013.01); *H04L 65/4084* (2013.01); *H04L 65/607* (2013.01); *H04L 65/80* (2013.01); *H04L 2001/0098* (2013.01)

(58) Field of Classification Search
CPC ... H04L 1/007; H04L 1/0041; H04L 65/4069; H04L 65/607; H04L 1/08; H04L 1/0057; H04L 1/0056; H04L 1/0075; H04L 1/1812; H04L 1/1854; H04L 1/0643; H04L 1/0007; H03M 13/353; H03M 13/356; H03M 13/3761; H03M 13/13; H03M 13/2906; H03M 13/255
See application file for complete search history.

(56) References Cited

U.S. PATENT DOCUMENTS

| | | | | |
|---|---|---|---|---|
| 7,272,117 | B2 * | 9/2007 | Park | H04L 1/0009 370/320 |
| 8,091,011 | B2 * | 1/2012 | Rajakarunanayake | H04L 1/0009 714/47.1 |
| 8,867,628 | B2 * | 10/2014 | Ozawa | H03M 13/2909 375/240.27 |
| 9,136,983 | B2 * | 9/2015 | Watson | H04L 1/0041 |
| 2005/0226196 | A1 * | 10/2005 | Suh | H04N 21/6582 370/338 |

(Continued)

OTHER PUBLICATIONS

Ozgu Alayy, Caleb Liy, Anurag Raiz, Thanasis Korakisy, Yao Wangy, and Shivendra Panwar Dynamic Rate and FEC Adaptation for Video Multicast in Multi-rate Wireless Networks; 2009, IEEE.*

(Continued)

*Primary Examiner* — Guerrier Merant

(57) ABSTRACT

A receiver, transmitter, and method for a dynamic forward error correction (FEC) are provided. In one embodiment, the method includes: 1) transmitting frames of data during a streaming session according to a FEC repair rate, each frame being contained in a plurality of source packets and having at least one repair packet; and 2) changing the FEC repair rate at least once during the streaming session based on at least one of a number of unrecovered source packets and a number of unused repair packets.

22 Claims, 2 Drawing Sheets

(56) References Cited

U.S. PATENT DOCUMENTS

| | | | | |
|---|---|---|---|---|
| 2012/0134373 A1* | 5/2012 | Song | ................ | H03M 13/3761 |
| | | | | 370/474 |
| 2014/0304570 A1* | 10/2014 | Baek | .................... | H03M 13/13 |
| | | | | 714/784 |
| 2015/0095739 A1* | 4/2015 | Zhovnirnovsky | ... | H03M 13/616 |
| | | | | 714/759 |
| 2015/0236819 A1* | 8/2015 | Zhovnirnovsky | ......... | H04L 1/08 |
| | | | | 370/216 |

OTHER PUBLICATIONS

Farhan Azmat Ali, Pieter Simoens, Wim Van de Meerssche, and Bart Dhoedt Bandwidth Efficient Adaptive Forward Error Correction Mechanism with Feedback Channel 2014—IEEE—vol. 16.*

Marcin Nagy, Varun Singh, Joerg Ott, Lars Eggert Congestion Control using FEC for Conversational Multimedia Communication; 2013.*

Li Zhuo; Kin-Man Lam ; Lansun Shen Adaptive forward error correction for streaming stored MPEG-4 FGS video over wireless channel 2005—IEEE.*

* cited by examiner

SYSTEM AND METHOD OF FORWARD ERROR CORRECTION FOR STREAMING MEDIA

TECHNICAL FIELD

This application is directed, in general, to forward error correction (FEC) and, more specifically, to a system and method of FEC for streaming media.

BACKGROUND

Game streaming and delay-sensitive content delivery over the Internet (the "cloud") is an area of intense technical interest. However, reliability is an important challenge standing in the way of ubiquitous streaming. Conventional reliability mechanisms tend to increase delay and jitter which is not desired for streaming applications. On the other hand, increased reliability usually requires the addition of redundancy, which reduces data channel bandwidth and limits performance.

Nvidia Shield® and Grid® cloud game streaming allows a client to play games on a remote server, or "transmitter." Output from the game takes the form of a video stream, which is typically encoded into an h264 video stream, "packetized" into multiple Real-time Transport Protocol (RTP) packets, and then transferred over the network to the client, or "receiver," where it is viewed. Quality of Service ("QoS") is important and should be maintained in an acceptable level. Unrecoverable video frames, typically caused by packet loss, cause either a frozen or corrupted view of the video. This is undesirable. To avoid frozen or corrupted video, frames can be repaired retroactively by resending lost packets. In this retransmission process, the receiver typically sends an invalidation message to the transmitter, specifying the packet or packets lost, and the transmitter responds by retransmitting the needed packets. Unfortunately, the retransmission process takes significant turn-around time, and with degraded network conditions, it results in significant video freezing and stuttering.

Packet-level FEC may be employed to recover lost/corrupt packets, avoiding retransmission and attending loss of bandwidth. Packet-level FEC works as follows. Assuming a video frame is split into K source packets (the value of K being dependent upon packet size), an FEC encoder creates (N-K) repair packets with N being a total number of packets for the frame, the value of N-K being based on a predefined FEC "repair rate." While the transmitter sends all N packets to the receiver, the repair packets allow an FEC decoder in the receiver to recover the packets assuming at least K packets have been successfully received. Packet-level FEC has proven to be an effective mechanism of compensating for lost or corrupted packets. The packet-level FEC is said to recover up to (N-K)/N percentage of lost packets.

SUMMARY

One aspect provides a method of a dynamic FEC. In one embodiment, the method includes: (1) transmitting frames of data during a streaming session according to a FEC repair rate, each frame being contained in a plurality of source packets and having at least one repair packet and (2) changing the FEC repair rate at least once during the streaming session based on at least one of a number of unrecovered source packets and a number of unused repair packets.

Another aspect provides a receiver of a dynamic FEC. In one embodiment, the receiver includes: (1) a physical layer interface configured to receive frames of data transmitted according to a FEC repair rate during a streaming session, each frame being contained in a plurality of source packets and having at least one repair packet and (2) a FEC repair rate detector configured to determine at least once during the streaming session that the predefined FEC repair rate needs to be changed based on at least one of a number of unrecovered source packets and a number of unused repair packets.

Yet another aspect provides a transmitter for a dynamic FEC. In one embodiment, the transmitter includes: (1) a physical layer interface configured to transmit frames of data during a streaming session according to a FEC repair rate, each frame being contained in a plurality of source packets and having at least one repair packet and (2) a FEC repair rate adjuster configured to change, at least once during the streaming session, the FEC repair rate based on at least one of a number of unrecovered source packets and a number of unused repair packets.

Yet still another aspect provides a transmitter for dynamic FEC. In one embodiment, the transmitter includes: (1) a physical layer interface configured to transmit frames of data during a streaming session according to a FEC repair rate, each frame being contained in a plurality of source packets and having at least one repair packet and (2) a FEC repair rate adjuster configured to change, at least once during the streaming session, the FEC repair rate based on a number of retransmission requests received from a receiver of the plurality of source packets during the streaming session.

BRIEF DESCRIPTION

Reference is now made to the following descriptions taken in conjunction with the accompanying drawings, in which.

DETAILED DESCRIPTION

Figure 1:
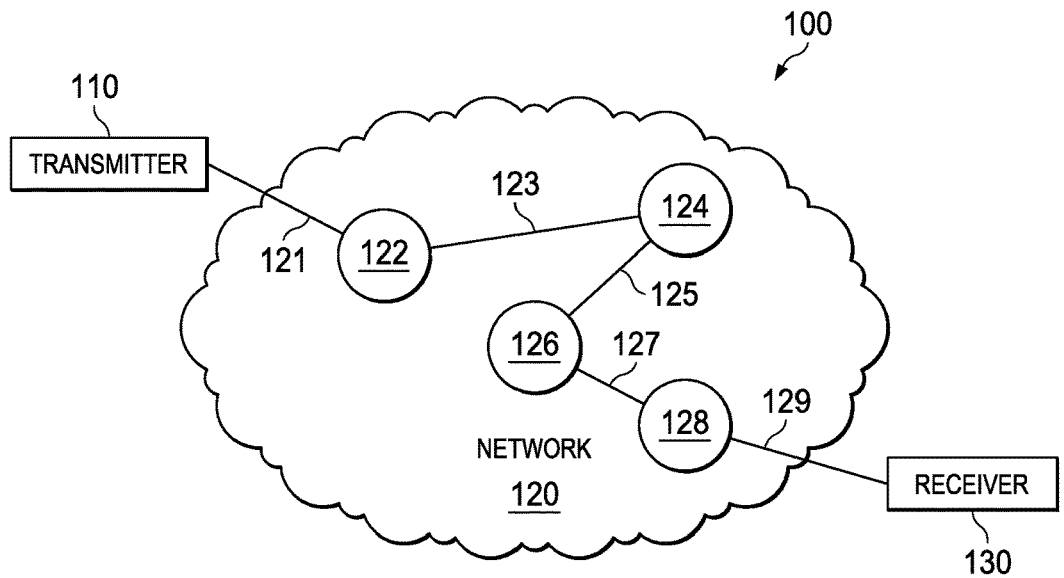
FIG. 1 is a block diagram of a portion of a network in which a data channel bearing a packetized video stream exists.

As stated above, packet-level FEC has proven to be an effective mechanism of compensating for lost or corrupted packets. However, it is realized herein that the predefined repair rate may render this packet-level FEC either insufficient or excessive, depending upon network conditions.

For example, assuming that the FEC repair rate is predefined and fixed for an entire streaming session, if network conditions become poorer than anticipated during the streaming session, the packet-level FEC becomes insufficient as there are not enough repair packets to repair all the lost/corrupted source packets, requiring retransmissions of those unrepaired source packets. On the other hand, if network conditions become better than anticipated during the streaming session, few, if any, source packets would be lost or corrupted, and many, if not all, unused repair packets would be discarded, making the packet-level FEC excessive and inefficient.

As such, it is realized herein that the FEC repair rate should not be predefined for an entire streaming session, but it should be defined dynamically such that it adapts to changing network conditions. Should network conditions be poorer than anticipated, the repair rate (and a number of the repair packets) may be increased, preventing excessive loss of lost/corrupted source packets. Should network conditions be better than anticipated, the repair rate (and a number of the repair packets) may be decreased, reducing overhead for repairs.

It is further realized herein that the FEC repair rate may be made dynamic by evaluating the repair process at the receiver and sending data reflective of that process to the transmitter periodically such that the FEC repair rate may be changed in real-time. In one embodiment, the evaluation may be such that the FEC repair rate provides just enough repair packets. In another embodiment, the evaluation may be such that the FEC repair rate provides more repair packets than absolutely necessary to provide a margin of safety in case of a network conditions degrade.

The data reflective of the repair process at the receiver may take different forms. The data may include: 1) a raw number of repair packets left unused for repair ("unused repair packets"); 2) a fraction (e.g., a percentage) of repair packets actually used for repair; 3) a raw number of lost/corrupted source packets left unrecovered ("unrecovered source packets"); and/or 4) a fraction of (e.g., a percentage) of lost/corrupt source packets actually recovered. In one embodiment, the data may be a target repair rate or an incrementing or decrementing command designed to increase or decrease the repair rate from its current value. Those skilled in the pertinent art will understand that the data provided by the receiver to the transmitter may take a variety of alternative forms.

In another embodiment, the transmitter itself may perform the analysis and adapt its own repair rate. In one related embodiment, the transmitter decreases the FEC repair rate until it experiences retransmission requests. In another related embodiment, the transmitter increases the FEC repair rate until it receives no retransmission requests, or fewer than a threshold rate of retransmission requests. In yet another related embodiment, the transmitter continues to increase the FEC repair rate until a margin of safety is attained in case network conditions degrade.

In various embodiments, changes in FEC repair rates may be made at different periodic or aperiodic intervals. Should transmission be through a relatively a stable network, the FEC repair rates may be changed relatively infrequently. On the other hand, should transmission be through an unstable or unpredictable network, the FEC repair rates may be changed more often.

Having generally described various embodiments, some embodiments will be particularly illustrated and described, together with a network that can form an environment within which the embodiments may operate. FIG. 1 is a block diagram of a network 120 in which a data channel bearing a packetized video stream exists. The network 120 may be a wired network, a wireless network or a hybrid network having both wired and wireless networks.

FIG. 1 shows a transmitter 110 and a receiver 130. The transmitter 110, e.g., a server, transmits streaming video data to the receiver 130, e.g., a client. The transmitter 110 is freely scalable and has the capacity to provide the streaming video data to many receivers simultaneously. The receiver 130 receives the transmitted streaming video data for display. The receiver 130 can be a variety of end-user devices, including a desktop or laptop personal computer, a tablet, a smartphone or a television.

In the illustrated embodiment, the network 120 provides a data channel that carries streaming video data from the transmitter 110 to the receiver 130. The data channel includes multiple physical links 121, 123, 125, 127, 129 connected by multiple routers 122, 124, 126, 128. The physical links 121, 123, 125, 127, 129 may be of various mediums or types, including Ethernet, Wi-Fi, and cellular connections, such as LTE, and may include various platforms such as Android®, Microsoft® Windows®, Ubuntu®, Linux®, and Mac® iOS®. Traffic passing through those links may use various protocols, including TCP and UDP.

Figure 2A:
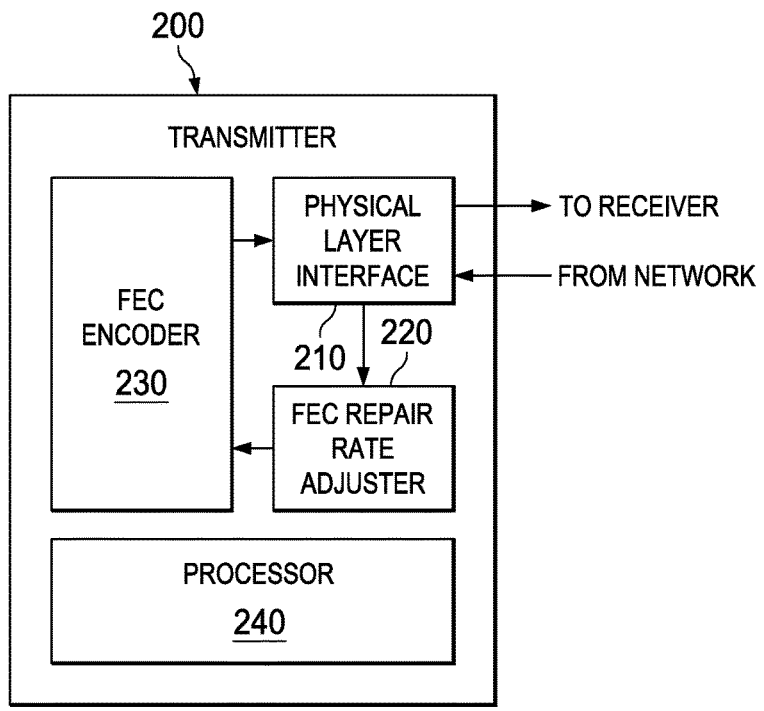
FIGS. 2A and 2B are block diagrams of respective embodiments of a transmitter and receiver for dynamically adjusting FEC for streaming video data.
Figure 2B:
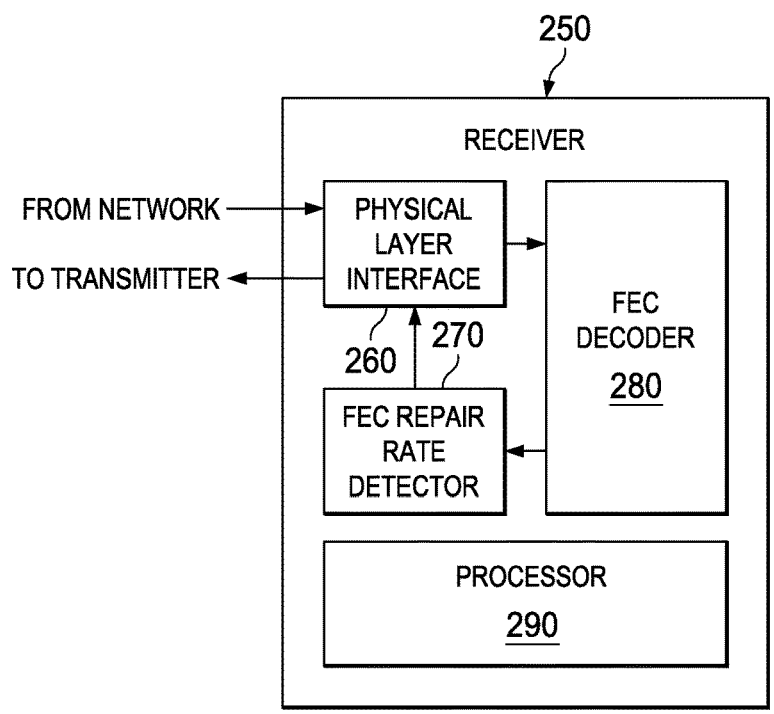

FIGS. 2A and 2B are block diagrams of embodiments of a transmitter 200 for dynamically adjusting FEC for streaming data and a receiver 250, coupled to the transmitter, for evaluating FEC for streaming data, respectively. The transmitter 200 may be the transmitter 110 of FIG. 1, and the receiver 250 may be the transceiver 130 of FIG. 1.

In FIG. 2A, the transmitter 200 includes a physical layer interface 210, a FEC repair rate adjuster 220, a FEC encoder 230, and a processor 240.

The physical layer interface 210 is configured to transmit frames of data according to a FEC repair rate during a streaming session. In the illustrated embodiment, each frame is contained in a plurality of source packets and has at least one repair packet. In one embodiment, all packets including both source and repair packets may have an embedded ID. The transmitted frames may be video frames of a streaming application, such as a gaming/multi-media application. The physical layer interface 210 may be a stand-alone module or functions embedded in a network interface card (NIC) (not shown) of the transmitter 200.

The physical layer interface 210 is also configured receive a FEC repair rate adjustment data, e.g., the data reflective of the repair process at the receiver 250, from the receiver 250 at least once during a given streaming session. The FEC repair rate adjustment data may be delivered through a separate, back-end communication channel so that it does not affect the bandwidth of a channel bearing streaming data.

In the illustrated embodiment, the FEC repair rate adjuster 220 is configured to change the FEC repair rate at least once during a given streaming session. The FEC repair rate is subject to change when the receiver 250 transmits data reflective of the repair process to the transmitter 200 or the receiver 250 transmits a retransmission request to the transmitter 200. The repair process data or the retransmission request may be sent periodically or aperiodically but is sent at least once during a given streaming session. As a general rule, should the network spanning the transmitter 200 and the receiver 250 be relatively stable, the receiver 250 may transmit the repair process data or the retransmission requests relatively infrequently, but should the network spanning the transmitter 200 and the receiver 250 be relatively unstable or unpredictable, the receiver 250 may transmit the repair process data or the retransmission requests more often. Those skilled in the pertinent art will understand any relationship that may exist between network conditions and the frequency at which the receiver 250 may transmit repair process data or retransmission requests.

The term "FEC repair rate" generally represents a fraction (e.g., a percentage) of data that needs to be reflected in the form of repair packets. The FEC repair rate establishes the extent to which the receiver is able to repair errors in transmitted data. In one embodiment, the data is transmitted with a predefined initial FEC repair rate. In such an embodiment, the initial FEC repair rate may be set at a minimum value such that the overhead for the FEC is kept at a minimum level until network conditions are such that it should increase to decrease retransmission requests. In an alternative embodiment, the initial FEC repair rate may be set above the minimum value at a level that reflects a margin of safety, such that should network conditions fluctuate slightly, the data may remain repairable without requiring retransmission requests. In another alternative embodiment, the initial FEC repair rate may be set at still a higher value and decreased until overhead is reduced to an acceptable level.

In the illustrated embodiment, the FEC repair rate adjuster 220 changes the FEC repair rate based on data reflective of the repair process at the receiver 250. The data may include: a raw number of repair packets left unused for repair ("unused repair packets"), a fraction (e.g., a percentage) of repair packets actually used for repair, a raw number of lost/corrupted source packets left unrecovered ("unrecovered source packets"), and a fraction of (e.g., a percentage) of lost/corrupt source packets actually recovered ("current FEC repair rate"). The data reflective of the repair process at the receiver may also include processed data such as a target repair rate, which is compared to the current FEC repair rate for adjustment, and a FEC repair rate adjustment data, which is an incremental or decremental command designed to increase or decrease the repair rate from its current value.

It is understood that the above list of the data is not exhaustive and may include other raw or processed data that are also reflective of the repair process at the receiver 250. It is also understood that the correspondences between the source packets and repair packets are closely tracked using their embedded IDs.

In one embodiment, the FEC repair rate is increased from the current FEC repair rate based on a number of unrecovered packets at the receiver 250. In another embodiment, the FEC repair rate is increased in proportion to the number of unrecovered source packets. In yet another embodiment, the FEC repair rate is increased only when a number of unrecovered source packets is greater than a certain threshold number such that the FEC repair rate is not increased too often. In still another embodiment, the FEC repair rate does not increase past a maximum FEC repair rate such that sufficient bandwidth for streaming data may be reserved.

In one embodiment, the FEC repair rate is decreased from the current FEC repair rate based on a number of unused repair packets. In another embodiment, the FEC repair rate is decreased in proportion to the number of unused repair packets. In yet another embodiment, the FEC repair rate is decreased only when a number of unused repair packets is greater a certain threshold number such that the FEC repair rate is not decreased too often. In still another embodiment, the FEC repair rate does not decrease past a minimum FEC repair rate such that a margin of safety is provided in case the network conditions degrade.

When the FEC repair rate (thus the number of transmitted repair packets and the overhead for the FEC) is decreased in a network, a number of transmitted frames and source packets thereof may be increased for better video quality, e.g., resolution, without sacrificing reliability of the network. In one embodiment where both the number of unrecovered source packets and the number of unused repair packets are zero, the FEC repair rate is maintained at a same value as before.

The FEC encoder 230 is configured to create at least one FEC repair packet based on the FEC repair rate. For example, if the transmitter 200 is transmitting a frame of twenty (20) source packets under a 50% FEC repair rate, the FEC encoder 230 may create ten (10) repair packets. While network conditions may not warrant a creation of any FEC repair packets, at least one repair packet is created to achieve a margin of safety.

The processor 240 is coupled to the physical layer interface 210, and configured to execute any functions of the FEC repair rate adjuster 220 and/or the FEC encoder 230 that are implemented as series of instructions stored in a memory (not shown).

Another embodiment will now be described. In this embodiment, the transmitter 200 itself performs the analysis and adapts its own repair rate instead of relying on the receiver 250 to perform the analysis. In such an embodiment, the transmitter 200 may begin at a relatively high initial FEC repair rate and thereafter decrease the FEC repair rate until it starts receiving retransmission requests from the receiver 250 for unrecovered source packets. Alternatively, the transmitter 200 may begin at a relatively low initial FEC repair rate and thereafter increase the FEC repair rate until it receives no retransmission requests, or fewer than a threshold (acceptable) rate of retransmission requests. In a related embodiment, the transmitter 200 may begin at a relatively low initial FEC repair rate and thereafter to increase the FEC repair rate past the point at which it no longer receives retransmission requests until a margin of safety is attained, thereby to accommodate fluctuations in network conditions.

In FIG. 2B, the receiver 250 includes a physical layer interface 260, a FEC repair rate detector 270, a FEC decoder 280, and a processor 290. The receiver 250 represents a client in a client-server architecture.

The physical layer interface 260 is configured to receive frames of data according to a FEC repair rate during a streaming session. The received frames are video frames of a streaming application, such as a gaming/multi-media application, and each frame is contained in a plurality of source packets and has at least one repair packet. In one embodiment, all packets including both source and repair packets have an embedded ID.

The physical layer interface 260 is also configured send a FEC repair rate adjustment data, e.g., the data reflective of the repair process, to the transmitter 200 at least once during a given streaming session. The FEC repair rate adjustment data may be delivered through a separate, back-end communication channel so that it does not affect the bandwidth of a channel bearing streaming data.

The physical layer interface 260 may be a stand-alone module or functions embedded in a network interface card (NIC) (not shown) of the receiver 250. In one embodiment, the receiver 250 sends data that the transmitter 200 employs to set an initial FEC repair rate. In such an embodiment, the initial FEC repair rate may be set at a minimum value such that the overhead for the FEC is kept at a minimum level until it has to increase.

The FEC repair rate detector 270 is configured to determine the FEC repair rate at least once during a given streaming session. Such a determination may be made periodically or aperiodically but must be made at least once during a given streaming session. A general rule is that should transmission be through a relatively a stable network, the determination is made relatively infrequently, and should transmission be through an unstable or unpredictable network, the determination is made more often.

In the illustrated embodiment, the FEC repair rate detector 270 determines the FEC repair rate based on data that is reflective of the repair process. The data may include: a raw number of repair packets left unused for repair ("unused repair packets"), a fraction (e.g., a percentage) of repair packets actually used for repair, a raw number of lost/corrupted source packets left unrecovered ("unrecovered source packets"), and a fraction of (e.g., a percentage) of lost/corrupt source packets actually recovered ("current FEC repair rate"). The data reflective of the repair process at the receiver 250 may also include processed data such as a target repair rate, which is compared to the current FEC repair rate for adjustment, and a FEC repair rate adjustment data, which is an incremental or decremental command designed to increase or decrease the repair rate from its current value.

It is understood that the above list of the data is not exhaustive and may include other raw or processed data that are also reflective of the repair process at the receiver 250. It is also understood that the correspondences between the source packets and repair packets are closely tracked using their embedded IDs.

When the FEC repair rate (thus the number of transmitted repair packets and the overhead for the FEC) is decreased in a network, a number of transmitted frames and source packets thereof may be increased for better video quality, e.g., resolution, without sacrificing reliability of the network. In one embodiment where both the number of unrecovered source packets and the number of unused repair packets are zero, the FEC repair rate is maintained at a same value as before.

The FEC decoder 280 is configured to recover some of the lost/corrupted source packets using the FEC repair packets. In one embodiment, the FEC decoder 280 is configured to recover the lost/corrupted source packets based on the FEC repair rate. The processor 290 is coupled to the physical layer interface 260 and configured to execute any functions of the FEC repair rate detector 270 and/or the FEC decoder 280 that are implemented as series of instructions stored in a memory (not shown).

Figure 3:
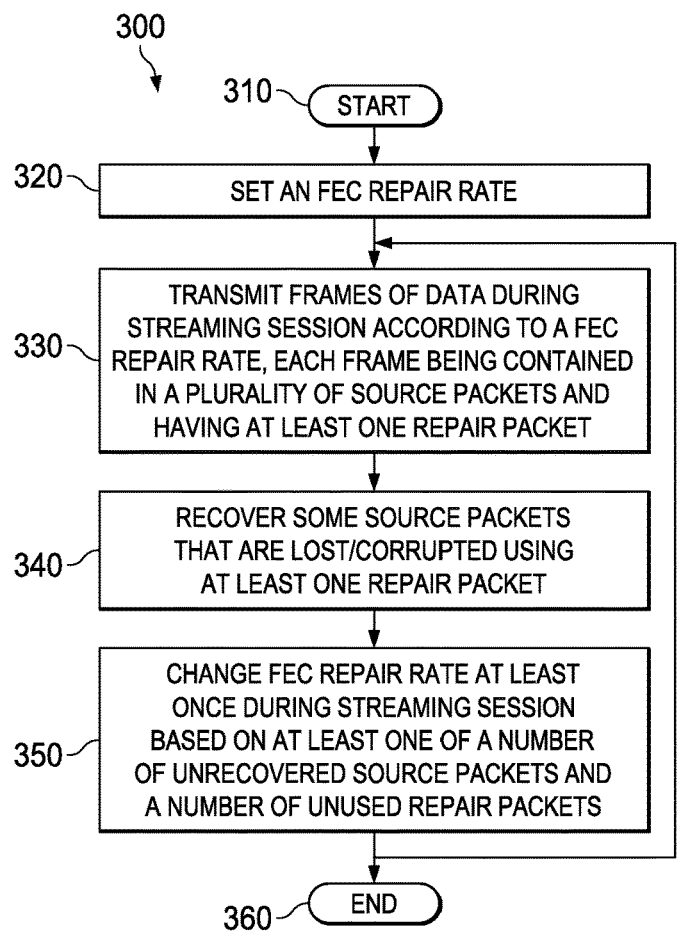
FIG. 3 is a flow diagram of one embodiment of a method of carrying out FEC for streaming video data.

FIG. 3 is a flow diagram of one embodiment of a method of carrying out dynamic FEC for streaming data. The illustrated method 300 may be implemented in a network where data is streamed over a data channel having multiple physical links of multiple types over multiple platforms. The method starts in a start step 310.

In a step 320, a FEC repair rate for a streaming session is set. In one embodiment, the FEC repair rate is set at a minimum value to keep the overhead for the dynamic FEC at minimum.

The streaming session starts, and in a step 330, frames of data is transmitted according to the FEC repair rate. Each frame is contained in a plurality of source packets and has at least one repair packet. In one embodiment, a FEC encoder, such as the FEC encoder 230 in FIG. 2A, creates FEC repair packets based on the FEC repair rate.

In a step 340, some of the lost/corrupted source packets are recovered using the FEC repair packets. In one embodiment, a FEC decoder, such as the FEC decoder 270 in FIG. 2B, uses the FEC repair packets to recover the lost/corrupted source packets.

In a step 350, the FEC repair rate is changed at least once during the streaming session. The FEC repair rate becomes subject to change whenever a transmitter receives data reflective of the repair process at a receiver or a retransmission request. The repair process data and the retransmission request may be sent periodically or aperiodically but must be sent at least once during a given streaming session.

A general rule is that should transmission be through a relatively a stable network, the repair process data and the retransmission requests are sent relatively infrequently, and should transmission be through an unstable or unpredictable network, the repair process data and the retransmission requests are sent more often.

In the illustrated embodiment, the FEC repair rate is changed based on data reflective of the repair process at a receiver, such as the receiver 250 in FIG. 2B. The data reflective of the repair process at the receiver may include: a raw number of repair packets left unused for repair ("unused repair packets"), a fraction (e.g., a percentage) of repair packets actually used for repair, a raw number of lost/corrupted source packets left unrecovered ("unrecovered source packets"), and a fraction of (e.g., a percentage) of lost/corrupt source packets actually recovered ("current FEC repair rate"). In one embodiment, the data may include processed data such as a target repair rate, which is compared to the current FEC repair rate for adjustment, and a FEC repair rate adjustment data, which is an incremental or decremental command designed to increase or decrease the repair rate from its current value.

In the step 350, the FEC repair rate may be increased from the current FEC repair rate based on a number of unrecovered packets at the receiver 250. In one embodiment, the FEC repair rate is increased in proportion to the number of unrecovered source packets. In another embodiment, the FEC repair rate is increased only when a number of unrecovered source packets is greater than a certain threshold number such that the FEC repair rate is not increased too often. In yet another embodiment, the FEC repair rate does not increase past a maximum FEC repair rate such that sufficient bandwidth for streaming data may be reserved.

In the step 350, the FEC repair rate may be decreased from the current FEC repair rate based on a number of unused repair packets. In one embodiment, the FEC repair rate is decreased in proportion to the number of unused repair packets. In another embodiment, the FEC repair rate is decreased only when a number of unused repair packets is greater a certain threshold number such that the FEC repair rate is not decreased too often. In yet another embodiment, the FEC repair rate does not decrease past a minimum FEC repair rate such that a margin of safety is provided in case the network conditions degrade.

In the step 350, the FEC repair rate may be maintained at a same value if both the number of unrecovered source packets and the number of unused repair packets are both zero. The steps 330, 340, and 350 are repeated at least once during a given streaming session. The method ends in an end step 360.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

The above-described apparatuses and methods or at least a portion thereof may be embodied in or performed by various, such as conventional, digital data processors or computers, wherein the computers are programmed or store executable programs of sequences of software instructions to perform one or more of the steps of the methods, e.g., steps of the method of FIG. 3. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 3, or functions of the apparatuses described herein, e.g., a receiver and a transmitter.

Certain embodiments of the invention further relate to computer storage products with a non-transitory computer-readable medium that have program code thereon for performing various computer-implemented operations that embody the apparatuses, the systems or carry out the steps of the methods set forth herein. For example, a FEC repair rate detector and a FEC repair rate adjuster can be implemented as such a computer storage product. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Those skilled in the art to which this application relates will appreciate that other and further additions, deletions, substitutions and modifications may be made to the described embodiments.

What is claimed is:

1. A method of a dynamic forward error correction (FEC), the method comprising:
   transmitting frames of data during a streaming session according to a FEC repair rate, each of said frames comprising a plurality of source packets and at least one repair packet; and
   changing said FEC repair rate at least once during said streaming session based on a number of unrecovered source packets and a number of unused repair packets.

2. The method of claim 1, wherein said FEC repair rate is set at a minimum value before said streaming session.

3. The method of claim 1, wherein said changing includes increasing said FEC repair rate based on said number of unrecovered source packets.

4. The method of claim 1, wherein said changing includes decreasing said FEC repair rate based on said number of unused repair packets.

5. The method of claim 1, further comprising maintaining said FEC repair rate at same value if both said number of unrecovered source packets and said number of unused repair packets are zero.

6. The method of claim 1, further comprising recovering some of said source packets that are lost/corrupted using said at least one repair packet.

7. The method of claim 4, further comprising increasing a number of said frames in said streaming session.

8. A receiver for a dynamic forward error correction (FEC), the receiver comprising:
   a physical layer interface configured to receive frames of data transmitted according to a FEC repair rate during a streaming session, each of said frames comprising a plurality of source packets and at least one repair packet; and
   a FEC repair rate detector configured to determine, at least once during said streaming session, that said FEC repair rate needs to be changed based on a number of unrecovered source packets and a number of unused repair packets.

9. The receiver of claim 8, further comprising a FEC decoder configured to recover some of said source packets that are lost/corrupted using said at least one repair packet.

10. The receiver of claim 8, wherein said FEC repair rate is set at a minimum value before said streaming session.

11. The receiver of claim 8, wherein said FEC repair rate is increased based on said number of unrecovered source packets.

12. The receiver of claim 8, wherein said FEC repair rate is decreased based on said number of used repair packets.

13. The receiver of claim 8, wherein said FEC repair rate is maintained at same value if both said number of unrecovered source packets and said number of unused repair packets are zero.

14. The receiver of claim 12, wherein a number of said frames in said streaming session is increased.

15. A transmitter for a dynamic forward error correction (FEC), the transmitter comprising:
   a physical layer interface configured to transmit frames of data during a streaming session according to a FEC repair rate, each of said frames comprising a plurality of source packets and at least one repair packet; and
   a FEC repair rate adjuster configured to change, at least once during said streaming session, said FEC repair rate based on a number of unrecovered source packets and a number of unused repair packets.

16. The transmitter of claim 15, further comprising a FEC encoder configured to create said at least one repair packet based on said FEC rate.

17. The transmitter of claim 15, wherein said FEC repair rate is set at a minimum value before said streaming session.

18. The transmitter of claim 15, wherein said FEC repair rate is increased in a proportion to said number of unrecovered source packets.

19. The transmitter of claim 15, wherein said FEC repair rate is decreased in proportion to said number of unused repair packets.

20. The transmitter of claim 15, wherein said FEC repair rate is maintained at same value if both said number of unrecovered source packets and said number of unused repair packets are zero.

21. The transmitter of claim 15, wherein said physical layer interface is further configured to increase a number of said frames in said streaming session when said FEC rate is decreased.

22. A system for dynamic forward error correction (FEC), comprising:
   a transmitter including:
   a physical layer interface configured to transmit frames of data during a streaming session according to a FEC repair rate, each of said frames comprising a plurality of source packets and at least one repair packet; and
   a FEC repair rate adjuster configured to change, at least once during said streaming session, said FEC repair rate based on a number of unrecovered source packets and a number of unused repair packets; and
   a receiver configured to receive said frames of data.

* * * * *